(12) United States Patent
Dodge

(10) Patent No.: US 9,064,566 B2
(45) Date of Patent: Jun. 23, 2015

(54) APPARATUSES AND METHODS INCLUDING SUPPLY CURRENT IN MEMORY

(71) Applicant: Micron Technology, Inc., Boise, ID (US)

(72) Inventor: Richard Dodge, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/216,115

(22) Filed: Mar. 17, 2014

(65) Prior Publication Data

US 2014/0211543 A1    Jul. 31, 2014

Related U.S. Application Data

(63) Continuation of application No. 13/465,632, filed on May 7, 2012, now Pat. No. 8,675,423.

(51) Int. Cl.
| | |
|---|---|
| *G11C 5/14* | (2006.01) |
| *G11C 13/00* | (2006.01) |
| *G11C 7/12* | (2006.01) |
| *G11C 29/02* | (2006.01) |

(52) U.S. Cl.
CPC .... *G11C 13/0004* (2013.01); *G11C 2013/0078* (2013.01); *G11C 7/12* (2013.01); *G11C 13/0007* (2013.01); *G11C 13/0038* (2013.01); *G11C 13/0069* (2013.01); *G11C 2213/79* (2013.01); *G11C 29/021* (2013.01); *G11C 13/0002* (2013.01)

(58) Field of Classification Search
CPC ............... G11C 13/0078; G11C 7/12; G11C 2013/0078
USPC .................................................... 365/189.09
See application file for complete search history.

(56) References Cited

U.S. PATENT DOCUMENTS

| | | |
|---|---|---|
| 5,796,650 A | 8/1998 | Wik et al. |
| 6,335,896 B1 | 1/2002 | Wahlstrom |
| 6,795,338 B2 | 9/2004 | Parkinson et al. |
| 6,898,114 B2 | 5/2005 | Hidaka |
| 6,990,017 B1 | 1/2006 | Parkinson et al. |
| 7,050,328 B2 | 5/2006 | Khouri et al. |
| 7,391,664 B2 | 6/2008 | Parkinson |
| 7,577,041 B2 | 8/2009 | Ueda |
| 7,589,343 B2 | 9/2009 | Lowrey |
| 7,646,630 B2 | 1/2010 | Lowrey et al. |
| 7,859,895 B2 | 12/2010 | Lowrey |
| 7,969,798 B2 | 6/2011 | Hwang et al. |
| 8,102,729 B2 | 1/2012 | Lee et al. |
| 8,675,423 B2 * | 3/2014 | Dodge ..................... 365/189.09 |
| 2009/0310402 A1 | 12/2009 | Parkinson |
| 2010/0157647 A1 | 6/2010 | Rinderson et al. |
| 2010/0232205 A1 | 9/2010 | Parkinson |

(Continued)

*Primary Examiner* — Son Mai
(74) *Attorney, Agent, or Firm* — Schwegman Lundberg & Woessner, P.A.

(57) ABSTRACT

Some embodiments include apparatuses and methods having first conductive lines, second conductive lines, a memory array including memory cells, each of the memory cells coupled between one of the first conductive lines and one of the second conductive lines. At least one of such apparatuses and methods can include a module configured to cause a first current from a first current source and a second current from a second current source to flow through a selected memory cell among the memory cells during an operation of storing information in the selected memory cell. Other embodiments including additional apparatuses and methods are described.

20 Claims, 11 Drawing Sheets

(56) References Cited

U.S. PATENT DOCUMENTS

2013/0170279 A9 7/2013 Huang et al.
2013/0294152 A1 11/2013 Kau et al.
2013/0294153 A1 11/2013 Dodge

* cited by examiner

200

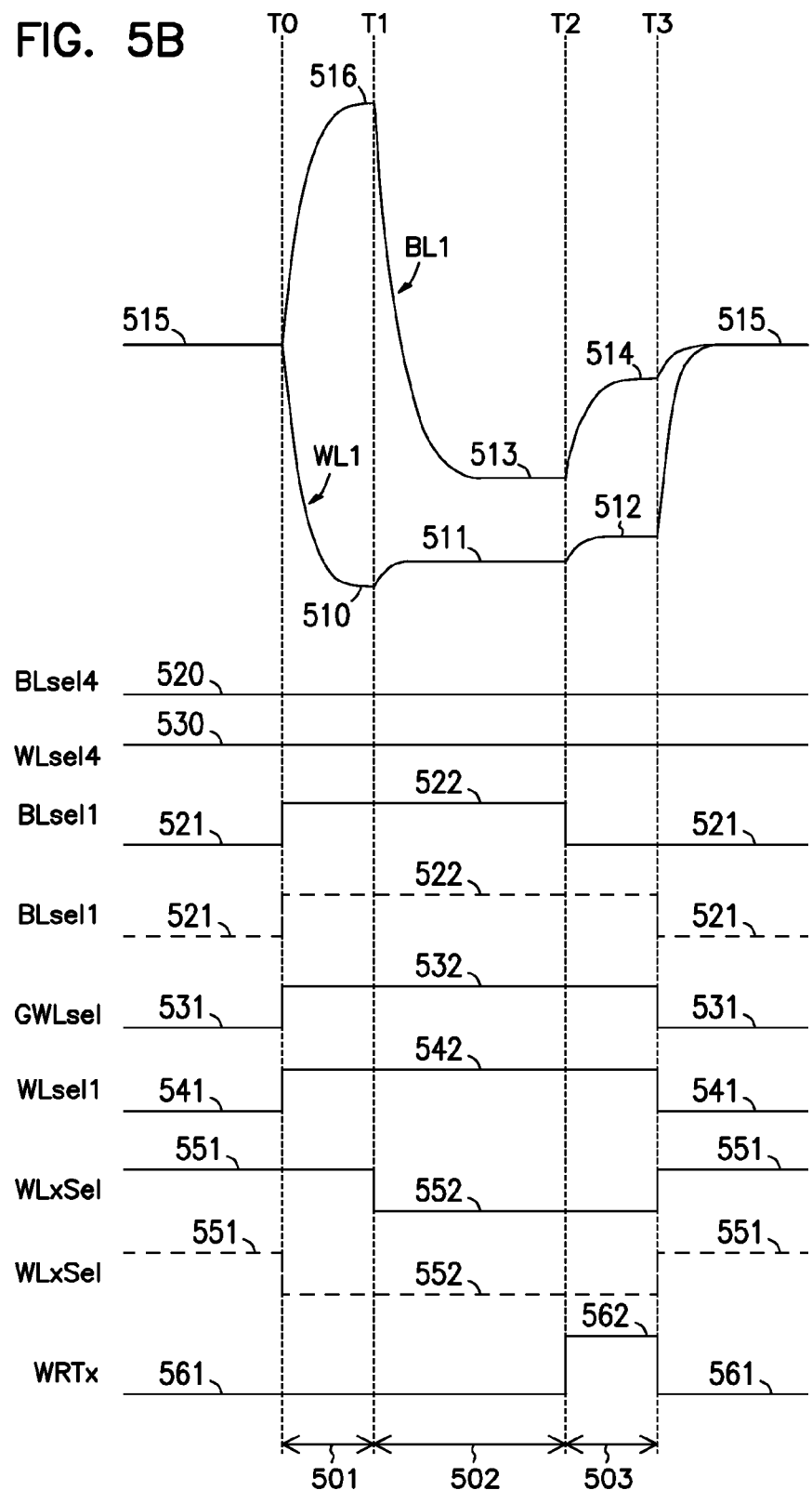

700

US 9,064,566 B2

APPARATUSES AND METHODS INCLUDING SUPPLY CURRENT IN MEMORY

PRIORITY APPLICATION

This application is a continuation of U.S. application Ser. No. 13/465,632, filed May 7, 2012, which is incorporated herein by reference in its entirety.

BACKGROUND

Computers and other electronic products, for example, digital televisions, digital cameras, and cellular phones, often have one or more memory devices to store information. Such memory devices usually have numerous memory cells and associated circuitry to access the memory cells. As memory cell density increases for a given device size, producing these types of memory devices to meet some design specifications including device size and cost may pose challenges.

BRIEF DESCRIPTION OF THE DRAWINGS

FIG. 5B is an example timing diagram for some signals of FIG. 5A during the example write operation, according to an embodiment of the invention.

DETAILED DESCRIPTION

Figure 1:
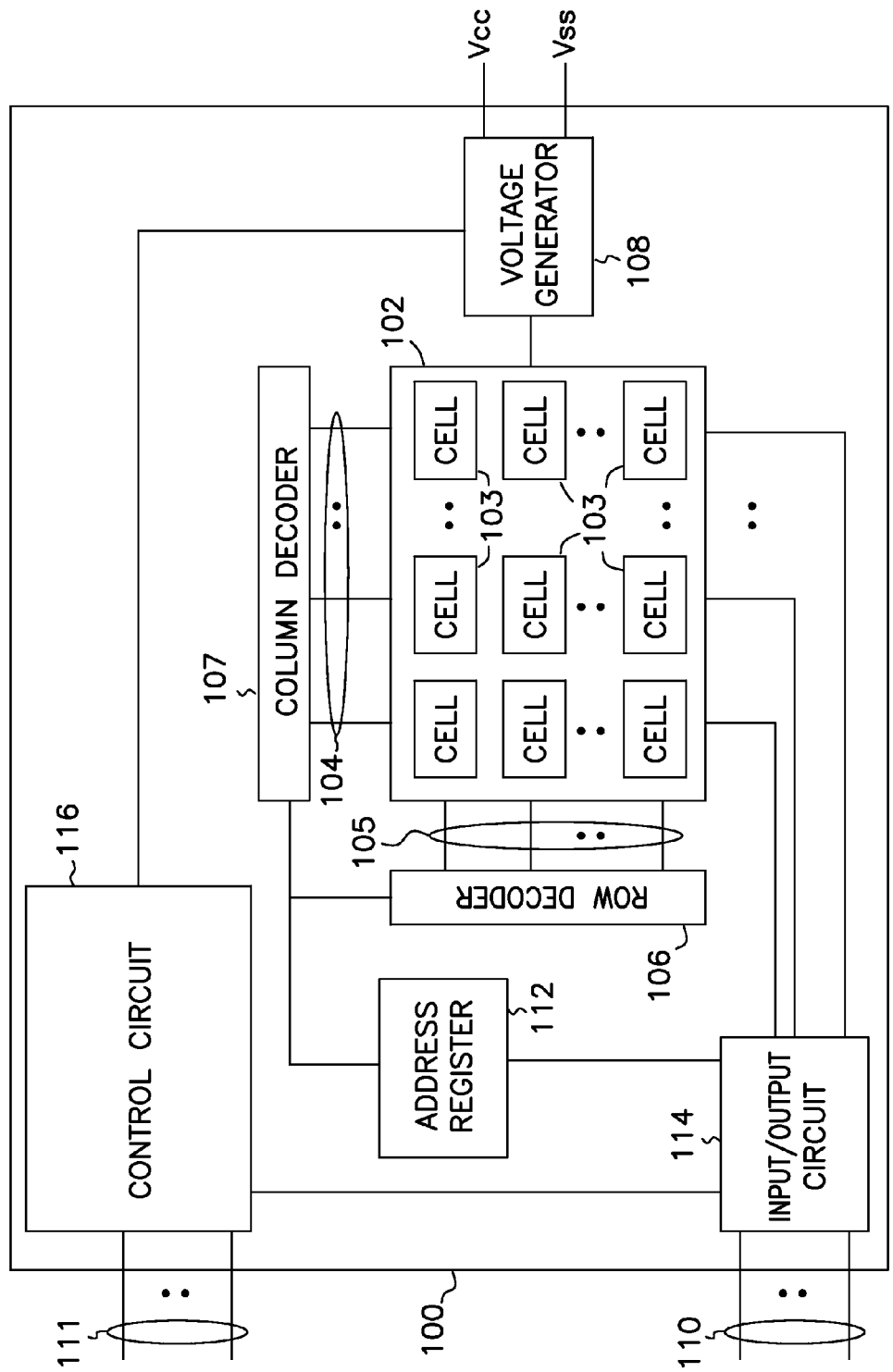
FIG. 1 shows a block diagram of an apparatus in the form of a memory device, according to an embodiment of the invention.

FIG. 1 shows a block diagram of an apparatus in the form of a memory device 100, according to an embodiment of the invention. A memory device, such as memory device 100, can include any device having some memory capability, such as, but not limited to, stand-alone memories, managed memories, processors and/or CPUs and/or logic circuits with embedded memory, sensors and/or other devices using code and/or data and/or parameter storage.

As shown in FIG. 1, memory device 100 can include a memory array 102 having memory cells 103 that can be arranged in rows and columns along with lines 104 and lines 105. Memory device 100 can include a row decoder 106 and a column decoder 107 coupled to memory cells 103 through lines 105 and lines 104, respectively.

Row and column decoders 106 and 107 can be configured to respond to an address register 112 to access memory cells 103 based on row address and column address signals on lines 110, 111, or both. A data input/output circuit 114 can be configured to exchange data between memory cells 103 and lines 110. Lines 110 and 111 can include nodes within memory device 100 (or alternatively, pins, solder balls, or other interconnect technologies such as controlled collapse chip connection (C4) or flip chip attach (FCA)) on a package where the memory device 100 can reside.

A control circuit 116 can control operations of memory device 100 based on signals present on lines 110 and 111. A device (e.g., a processor or a memory controller, not shown in FIG. 1) external to memory device 100 can send different commands (e.g., read, write, or erase command) to memory device 100 using different combinations of signals on lines 110, 111, or both.

Memory device 100 can be configured to respond to commands to perform memory operations, such as a read operation to read information from memory cells 103 and a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a voltage generator 108. Control circuit 116 and voltage generator 108 can be configured to generate different voltages for use during memory operations of memory device 100. For example, voltages generated by voltage generator 108 can be applied (e.g., in the form of signals) to lines 104 and 105 during a read or write operation to access memory cells 103. Voltage generator 108 and control circuit 116 (or parts thereof) can be referred to separately or together as a module to cause the application of voltages to components (e.g., lines 104 and 105) of memory device 100.

Each of memory cells 103 can be programmed to store information representing a value for a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" for two bits, or one of eight possible values "000", "001", "010", "011", "100", "101", "110", and "111" for three bits, or one of other values for another number of multiple bits. A memory cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a variable resistance memory device (e.g., a phase change memory (PCM) device or a resistive random access memory (RRAM) device), or another kind of memory device, such as a flash memory device (e.g., a NAND flash or a NOR flash memory device).

In memory device 100, each of memory cells 103 can include a material. At least a portion of the material can be programmed to change between different states. The different states can have different resistance values and/or different threshold voltage values. Such resistance values and/or threshold voltage values can be configured to represent different values of information stored in each of memory cells 103.

Memory device 100 can include a memory device where memory cells 103 can be physically located in multiple levels on the same device. For example, some of memory cells 103 can be stacked over some other memory cells 103 in multiple levels over a substrate (e.g., a semiconductor substrate) of memory device 100.

One of ordinary skill in the art may recognize that memory device 100 can include other elements. FIG. 1 omits such elements so as not to obscure some example embodiments described herein.

Memory device 100 may include memory devices and operate using memory operations similar to or identical to memory devices and operations described below with reference to FIG. 2A through FIG. 8.

Figure 2A:
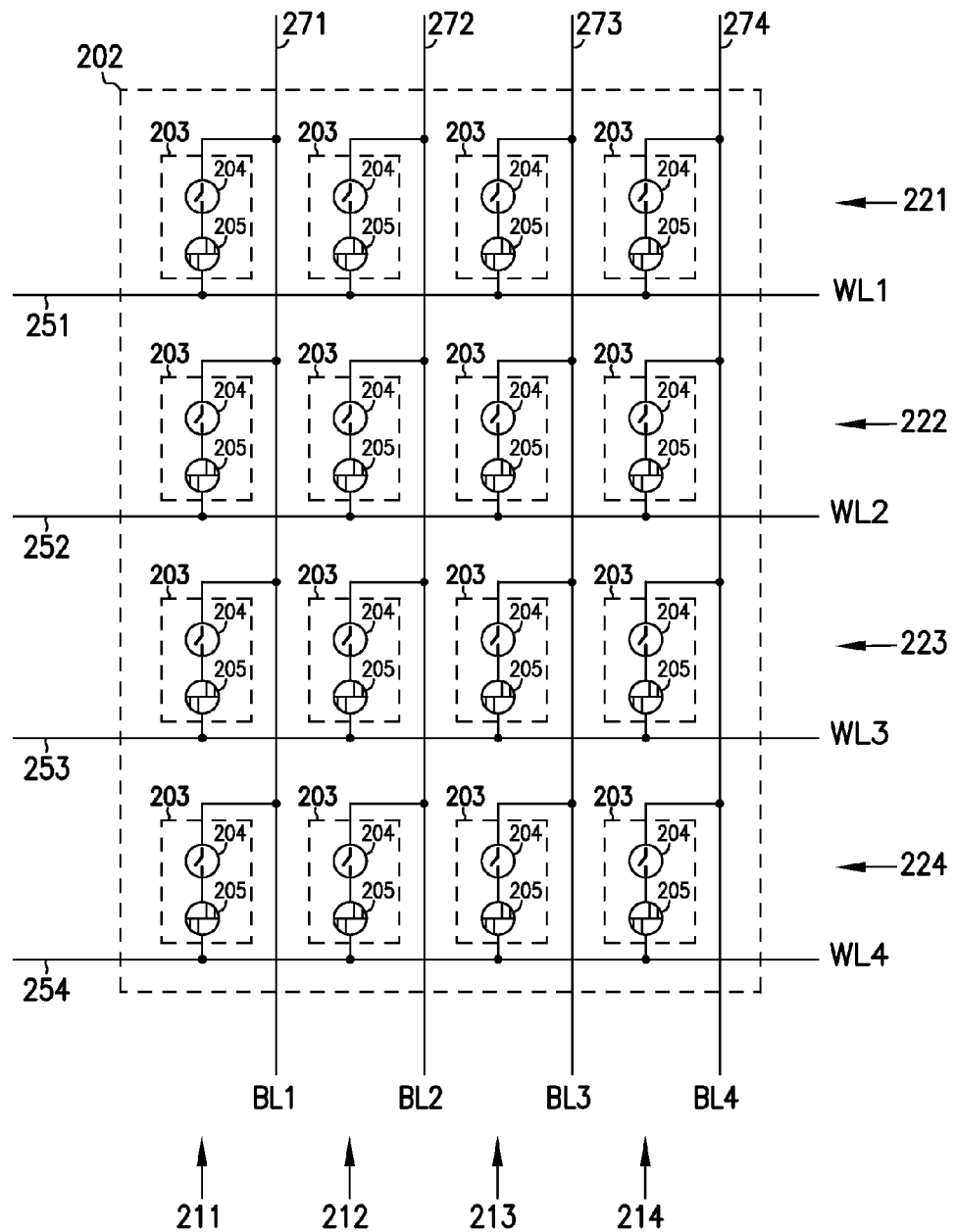
FIG. 2A shows a schematic diagram of a portion of a memory device having a memory array, according to an embodiment of the invention.

FIG. 2A shows a schematic diagram of a portion of a memory device 200 having a memory array 202, according to an example embodiment. Memory device 200 can be associated with memory device 100 of FIG. 1. For example, memory array 202 of FIG. 2A can form a portion of memory array 102 of memory device 100 of FIG. 1.

As shown in FIG. 2A, memory array 202 can include memory cells 203 that can be arranged in a number of rows 221, 222, 223 and 224 and a number of columns 211, 212, 213 and 214. Each of memory cells 203 can be coupled between one of lines 251, 252, 253, and 254 and one of lines 271, 272, 273, and 274. FIG. 2A shows an example of four lines 251, 252, 253, and 254 and four lines 271, 272, 273, and 274 and associated 16 memory cells 203. The number of lines and memory cells can vary.

Lines 251, 252, 253, and 254 and lines 271, 272, 273, and 274 can be configured as access lines (e.g., column and row access lines) to access memory cells 203. Either lines 251, 252, 253, and 254 or lines 271, 272, 273, and 274 can also be configured (e.g., as data lines) to provide information read from memory cells or information to be stored into memory cells 203.

Physically, lines 251, 252, 253, and 254 and lines 271, 272, 273, and 274 can be structured as conductive lines extending in different directions. The directions can be perpendicular to each other. For example, lines 271, 272, 273, and 274 can extend in one direction (e.g., x-direction) and lines 251, 252, 253, and 254 can extend in another direction (e.g., y-direction) perpendicular to the direction of lines 271, 272, 273, and 274. Lines 251, 252, 253, and 254 can physically pass over (e.g., cross over and not directly couple to) lines 271, 272, 273, and 274 at a number of different cross points. Each of memory cells 203 can be located between and coupled to one of lines 251, 252, 253, and 254 and one of lines 271, 272, 273, and 274 at one of the cross points. Thus, memory array 202 can be, for example, a cross-point memory array. Memory cells 203 can be non-volatile memory cells.

As shown in FIG. 2A, each of memory cells 203 can include an access component 204 and a storage element 205. Storage element 205 can be configured to store information. For example, storage element 205 can be configured to store a value representing a value of a fraction of a bit, a single bit, or multiple bits. Access component 204 in each of memory cells 203 can be configured to operate as a switch to access storage element 205 in the same memory cell.

Storage element 205 can include a material where at least a portion of the material can be changed (e.g., in a write operation) between different states (e.g., different material phases). The different states can have a range of different resistance values and/or different threshold voltage values. Different resistance values and/or threshold voltage values can be configured to represent different values of information stored in each of memory cells 203.

Access component 204 can include a material where at least a portion of the material can be configured to change (e.g., switch) between a non-conductive state and a conductive state. For example, when one of memory cells 203 is selected in a memory operation, memory device 200 can cause access component 204 of the selected memory cell to turn on (e.g., change from a non-conductive state to a conductive state). This allows access to storage element 205 of the selected memory cell.

A memory operation in memory device 200 can include different stages. The stages can include an access stage followed by either a sense stage (e.g., read stage) or a program stage (e.g., write stage). In the access stage, memory device 200 can turn on access component 204 of a selected memory cell 203 to access storage element 205 of the selected memory cell. If the memory operation is a read operation, memory device 200 can perform an access stage followed by a sense stage to sense information from the selected memory cell. Based on sensed information, memory device 200 can determine the value of information stored in the selected memory cell. If the memory operation is a write operation, memory device 200 can perform an access stage followed by a program stage to store information into the selected memory cell.

Storing information into storage element 205 of a selected memory cell (one of memory cells 203) in a write operation can include causing storage element 205 of the selected memory cell 203 to have a specific resistance value. The specific resistance value can be configured to represent the value of information to be stored into the selected memory cell. Thus, sensing information from a selected memory cell (e.g., in a read operation) can include measuring a resistance value of storage element 205 of the selected memory cell. Measuring the resistance value can include determining a value of a signal (e.g., an electrical current signal) going through the selected memory cell. Based on a measured value of the signal, a corresponding value of the information stored in the selected memory cell can be determined.

As described above, in a memory operation, one of memory cells 203 can be the selected memory cell and accessed to read information from or to store information into the selected memory cell. In a memory operation, a selected memory cell can be associated with two selected lines (e.g., selected row and column access lines). One selected line can be from one of lines 251, 252, 253, and 254. The other selected line can be from one of lines 271, 272, 273, and 274. To access a selected memory cell, memory device 200 can turn on access component 204 of the selected memory cell based on a voltage difference between the two selected lines.

In FIG. 2A, depending on which of memory cells 203 is a selected memory cell in a memory operation, memory device 200 can apply different voltages to lines 251, 252, 253, and 254 and lines 271, 272, 273, and 274. The different voltages can have different values to turn on access component 204 of only the selected memory cell. This allows access to only the selected memory cell. Access component 204 of memory cells 203 that are unselected (in other words, not selected) can turn off (e.g., remain in a non-conductive state). Thus, memory cells 203 that are unselected in the memory operation are not accessed.

In the following example memory operation, memory cell 203 located at the cross-point of row 221 and column 211 is assumed to be a selected memory cell. Other memory cells 203 can be referred to as unselected memory cells. Two lines that are directly coupled to a selected memory cell can be referred to as selected lines. Thus, in this example, lines 251 and lines 271 can be referred to as selected lines. Lines that are not directly coupled to the selected memory cell can be referred to as unselected lines. Thus, in this example, lines 252, 253, 254, 272, 273, and 274 can be referred to as unselected lines.

In the example memory operation, memory device 200 can apply different voltages to lines 251 and 271 (e.g., two selected lines). The voltages on lines 251 and 271 can have values such that a voltage difference between lines 251 and 271 can cause access component 204 of the selected memory cell to turn on. This allows access to storage element 205 of the selected memory cell. Memory device 200 can either read information from or store information into the selected memory cell after it is accessed. Memory device 200 can read information from the selected memory cell if the example memory operation is a read operation. Memory device 200 can store information into the selected memory cell if the example memory operation is a write operation.

In the above example memory operation, memory device 200 can also apply voltages to the unselected lines (lines 252, 253, 254, 272, 273, and 274). However, the voltages applied to the unselected lines can have values such that a voltage difference between each of lines 252, 253, and 254 and each of lines 272, 273, and 274 can be insufficient to turn on access component 204 of the unselected memory cells coupled to the unselected lines (e.g., memory cells 203 at intersections of columns 212, 213, and 214 and rows 222, 223, and 224). Voltages applied to the unselected lines can have values such that a voltage difference between line 271 and each of lines 252, 253, and 254 and a voltage difference between line 251 and each of lines 272, 273, and 274 can be insufficient to turn on access component 204 of the unselected memory cells coupled to the selected lines (e.g., memory cells 203 at intersections of columns 212, 213, and 214 and row 221 and memory cells 203 at intersections of rows 222, 223, and 224 and column 211). Thus, unselected memory cells are not accessed.

Storage element 205 can include a variable resistance material. For example, storage element 205 can include a phase change material. An example of a phase change material includes a chalcogenide material. Examples of chalcogenide materials include various combinations of germanium (Ge), antimony (Sb), tellurium (Te), and/or other similar materials.

A phase change material can be configured to change between a crystalline state (sometimes referred to as crystalline phase) and an amorphous state (sometimes referred to as amorphous phase). The phase change material can have one resistance value when it is in the crystalline state and another resistance value when it is in the amorphous state. These different resistance values of the phase change material can be configured to represent different values of information stored in a storage element, such as storage element 205 of memory device 200.

Access component 204 can include a variable resistance material (e.g., phase change material). However, the material of access component 204 can be configured such that it can operate only as a switch (e.g., not to store information) to allow access to storage element 205, as described above. For example, access component 204 can include a phase change material that can be configured to operate as an ovonic threshold switch (OTS).

The ovonic threshold switch can have a threshold voltage (e.g., Vt) such that the ovonic threshold switch can switch from a non-conductive state (e.g., a highly resistive state) to a conductive state (a lower resistive state) when a voltage across it exceeds the threshold voltage. An amount of current can flow through the ovonic threshold switch when it is the conductive state. The amount of current can decrease after a time. When the amount of current reaches a specific value (e.g., a holding current value), the ovonic threshold switch can switch back to the non-conductive state. This switching of the ovonic threshold switch can also happen if the polarities of the voltages across the ovonic threshold switch are changed.

In FIG. 2A, if access component 204 is configured as an ovonic threshold switch, memory device 200 can cause a voltage difference between two selected lines coupled to a selected memory cell 203 to have value, such that the ovonic threshold switch formed by access component 204 of a selected memory cell can switch from a non-conductive state to a conductive state. This allows access to the selected memory cell.

Figure 2B:
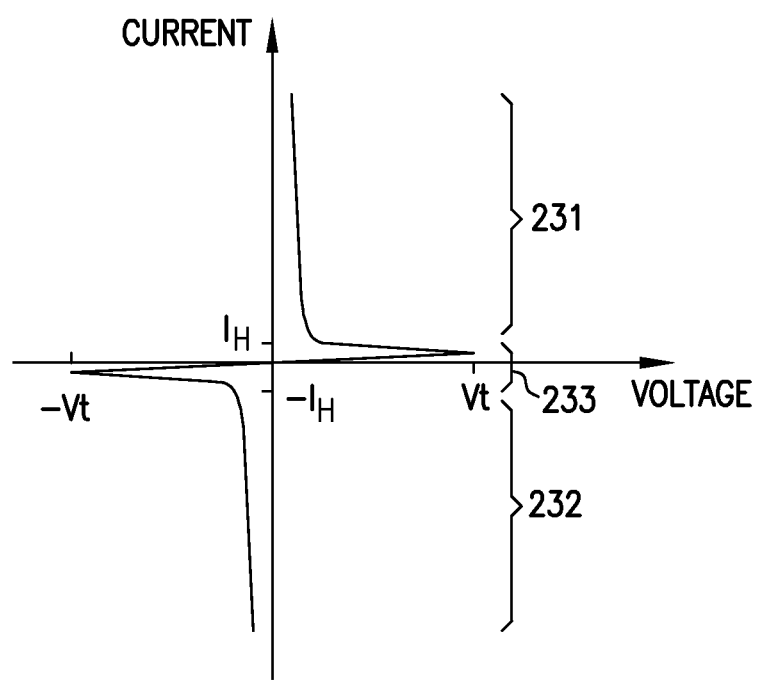
FIG. 2B is a graph showing an example of a current versus voltage (IV) curve of an access component in a memory cell of the memory device of FIG. 2A.

FIG. 2B is a graph showing an example of an IV curve of access component 204 of FIG. 2A. The IV graph in FIG. 2 shows an example where access component 204 includes a phase change material configured to operate as an ovonic threshold switch. As shown in FIG. 2B, access component 204 can be in a conductive state in regions 231 and 232 and in a non-conductive state in region 233. "$I_H$" and "$-I_H$" can correspond to holding current values of access component 204 where access component 204 can switch between a conductive state and a non-conductive state. As shown in FIG. 2B, access component 204 can switch from a non-conductive state (e.g., region 233) to a conductive state (e.g., region 231) when a voltage across memory cell 203 (FIG. 2A) exceeds a threshold voltage (Vt) of the ovonic threshold switch formed in access component 204. In the conductive state (region 231), the value of current flowing through access component 204 can be greater than holding current value $I_H$. When the value of current flowing through access component 204 falls below holding current value $I_H$, access component 204 can switch from a conductive state (e.g., region 231) to a non-conductive state (e.g., region 233).

Similarly, as shown in FIG. 2B, access component 204 can switch between non-conductive state (e.g., region 233) and conductive state (e.g., region 232) depending on the value of voltage across memory cell 203 (FIG. 2A) relative to that of threshold voltage (-Vt) and the value of current flowing through access component 204 relative to that of holding current value $-I_H$.

Memory device 200 of FIG. 2A can include memory devices and operate using memory operations similar to or identical to memory devices and operations described below with reference to FIG. 3 through FIG. 8.

Figure 3:
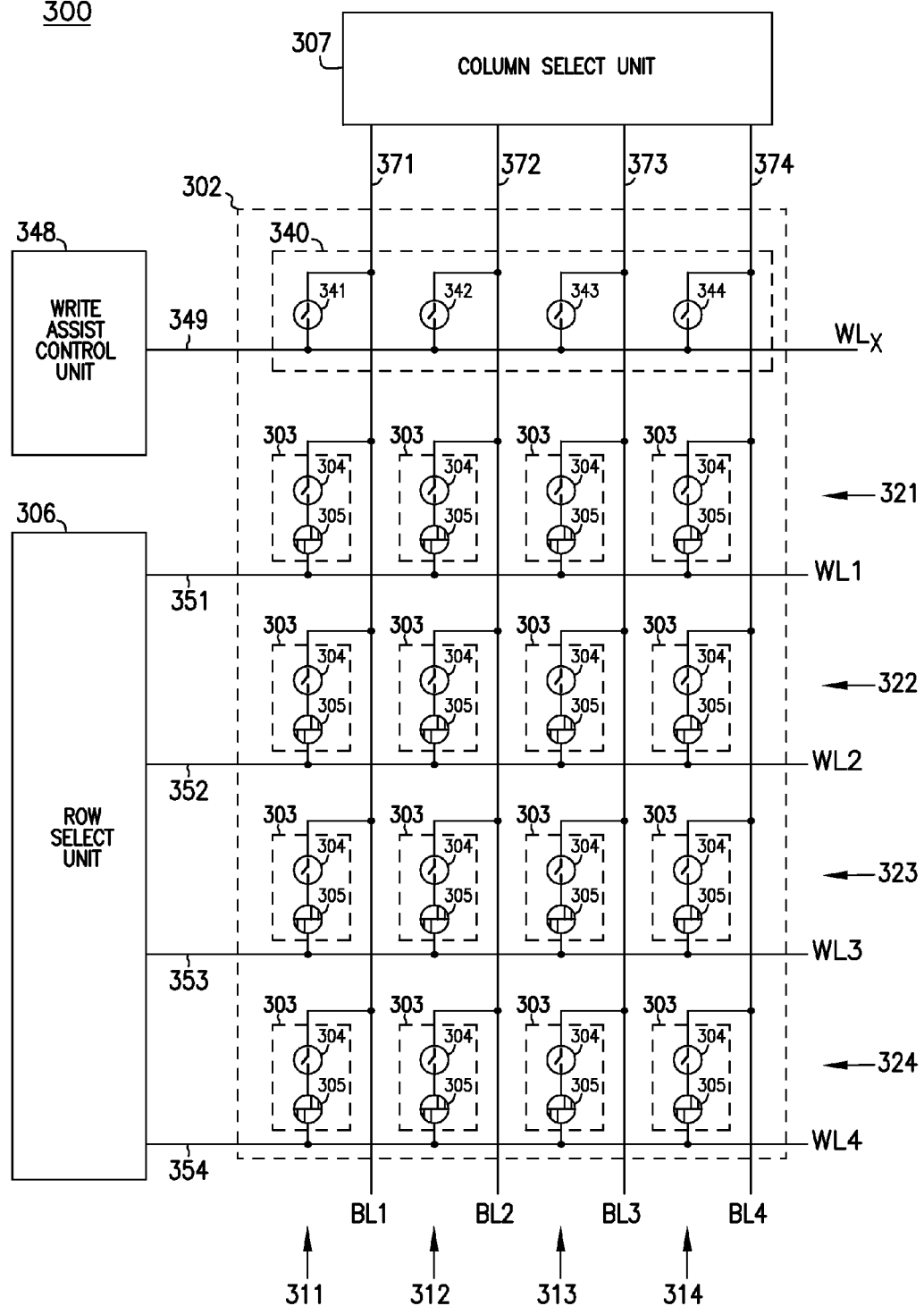
FIG. 3 shows a schematic diagram of a portion of a memory device including a memory array having a switching circuit, according to an embodiment of the invention.

FIG. 3 shows a schematic diagram of a portion of a memory device 300 including a memory array 302 including switching circuit 340, according to an embodiment of the invention. Memory device 300 can be associated with memory device 100 of FIG. 1 or memory device 200 of FIG. 2A. For example, memory array 302 of FIG. 3 can form a portion of memory array 102 of memory device 100 of FIG. 1 or a portion of memory array 202 of memory device 200 of FIG. 2A.

As shown in FIG. 3, memory array 302 can include memory cells 303 arranged in rows 321, 322, 323, and 324 and columns 311, 312, 313, and 314. Memory device 300 can include lines (e.g., access lines) 351, 352, 353, and 354, which can correspond to lines 251, 252, 253, and 254 of FIG. 2A. Memory device 300 can include lines (e.g., data lines) 371, 372, 373, and 374, which can correspond to lines 271, 272, 273, and 274 of FIG. 2A. Lines 351, 352, 353, and 354 can physically pass over (e.g., cross over and not directly couple to) lines 371, 372, 373, and 374 at a number of different cross points. Each of memory cells 303 can be located between and coupled to one of lines 351, 352, 353, and 354 and one of lines 371, 372, 373, and 374 at one of the cross points.

Memory device 300 can include line 349 that can carry a signal $WL_X$. Physically, line 349 can be structured as a conductive line extending in the same direction as that of lines 351, 352, 353, and 354. The directions can be perpendicular to each other.

FIG. 3 shows an example of four lines 351, 352, 353, and 354 and four lines 371, 372, 373, and 374 and 16 memory cells 303. The number of lines and memory cells can vary.

Each of memory cells 303 can include an access component 304 and a storage element 305. Memory cells 303 can be configured to include function and operation similar to or identical to those of memory cells 203 of FIG. 2A. For example, storage element 305 can be configured to store information. Access component 304 can be configured to access storage element 305. Access component 304 and storage element 305 in FIG. 3 can include materials (e.g., phase change materials) similar to or identical to those of access component 204 and storage element 205, respectively, of FIG. 2A.

Memory device 300 can include row and column select units 306 and 307, respectively, configured to access memory cells 303 during a memory operation. Row and column select units 306 and 307 can be part of row and column decoders (such as row and column decoders 106 and 107 of FIG. 1) of memory device 300.

Row select unit 306 can be configured to access lines 351, 352, 353, and 354 during a memory operation of memory device 300. Lines 351, 352, 353, and 354 can carry corresponding signals WL1, WL2, WL3, and WL4.

Column select unit 307 can be configured to provide voltage, current, or both to lines 371, 372, 373, and 374 during a memory operation of memory device 300. Lines 371, 372, 373, and 374 can carry corresponding signals BL1, BL2, BL3, and BL4.

In a memory operation (e.g., a read or write operation), one of lines 371, 372, 373, and 374 can be a selected line (e.g., selected column access line) to access a selected memory cell. One of lines 351, 352, 353, and 354 can also be a selected line (e.g., selected row access line).

Switching circuit 340 can include switches 341, 342, 343, and 344. Switching circuit 340 can be located in the same memory array 302 as that of memory cells 303. Thus, similar to memory cells 303, each of switches 341, 342, 343, and 344 can be located between and coupled to line 349 and one of lines 371, 372, 373, and 374 at one of the cross points between line 349 and one of lines 371, 372, 373, and 374.

Although not shown in FIG. 3, memory device 300 can include an additional elements where each of the additional elements (similar to storage element 305) can be coupled in series with an associated switch among switches 341, 342, 343, and 344 between line 349 and one of lines 371, 372, 373, and 374. The series combination of the additional element and one of switches 341, 342, 343, and 344 can be similar to the series combination of access component 304 and storage element 305 in of each memory cells 303. The additional element associated with each of switches 341, 342, 343, and 344 can include a material (e.g., a phase change material) similar to the material of storage element 305. However, the phase of the material of the additional element can remain unchanged (e.g., regardless of the amount of current flowing through it), such that the additional element may not be configured to store information but can allow a current passing through it. The additional element and storage element 305 may be processed differently and/or have different physical dimensions.

A material of switches 341, 342, 343, and 344 can be similar to or identical to those of access component 304. For example, each of switches 341, 342, 343, and 344 can include a variable resistance material (e.g., a phase change material). Switches 341, 342, 343, and 344 can be configured to operate as ovonic threshold switches. Each of switches 341, 342, 343, and 344 can have a threshold voltage less than that of the threshold voltage of access component 304. When a selected switch (one of switches 341, 342, 343, and 344) turns on, a conductive path can be formed between line 349 and one of lines 371, 372, 373, and 374 that is coupled to the selected switch. Each of switches 341, 342, 343, and 344 can be turned on by causing a voltage difference between line 349 and one of lines 371, 372, 373, and 374 associated with that switch, such that the value of the voltage difference can exceed the threshold voltage value of the switch to turn it on.

A write assist control unit 348 can be configured to provide line 349 with a voltage and a current during a write operation. The voltage on line 349 can be selected such that the voltage difference between line 349 and one of lines 371, 372, 373, and 374 associated with that switch to be turned on, can exceed the threshold voltage value of the switch to turn it on. The current on line 349 can assist in storing information in a selected memory cell 303, as discussed in more details below.

In a write operation, write assist control unit 348 can be activated (e.g., enabled) and turn on a selected switch among switches 341, 342, 343, and 344. A conductive path can be formed between line 349 and a corresponding line (e.g., selected line column) 371, 372, 373, or 374 via the selected switch. Two different currents can flow through a selected memory cell through two different conductive paths. A current (e.g., current I1, not shown in FIG. 3) from column select unit 307 can flow through a selected memory cell via one of lines 371, 372, 373, and 374 coupled to the selected memory cell. Another current (e.g., current I2, not shown in FIG. 3) from write assist control unit 348 can flow through the selected memory cell via a conductive path that includes a portion of line 349, one of switches 341, 342, 343, and 344 that turns on, and a portion of one of lines 371, 372, 373, and 374 coupled to the selected memory cell. The combination of the two currents (e.g., currents I1 and I2) can cause storage element 305 of the selected memory cell to change its state to reflect information being stored in the selected memory cell.

In a read operation, write assist control unit 348 can be deactivated (e.g., in other words, not activated, or disabled). Switches 341, 342, 343, and 344 can be turned off. Thus, a conductive path is not formed between line 349 and any of lines 371, 372, 373, and 374 (selected and unselected lines). Therefore, no current from line 349 flows from line 349 to the selected memory cell. In a read operation, memory device 300 can sense the voltage or current on a selected line (e.g., selected line column) among lines 371, 372, 373, and 374 to retrieve information stored in the selected memory cell associated with the selected line.

In the following example memory operation, memory cell 303 located at cross point of row 321 and column 311 is assumed to be a selected memory cell in either a read or write operation. Other memory cells 303 can be referred to as unselected memory cells. In this example, lines 351 and lines 371 can be referred to as selected lines. Lines 352, 353, 354, 372, 373, and 374 can be referred to as unselected lines.

In the example memory operation, memory device 300 can apply voltages on lines 351 and 371 (e.g., during an access stage). The voltages can have values, such that a voltage difference between the voltages can cause access component 304 of the selected memory cell (directly coupled between lines 351 and 371) to turn on. This allows access to storage element 305 of the selected memory cell.

Memory device 300 can also apply voltages to the unselected lines (lines 352, 353, 354, 372, 373, and 374) such that unselected memory cells are not accessed. In this example, unselected memory cells include all memory cells 303 in FIG. 3, except for memory cell 303 (selected) located at cross point of row 321 and column 311. The values of the voltages applied to the unselected lines can have values, such that a voltage difference between each of lines 352, 353, and 354 (unselected row lines) and each of lines 372, 373, and 374 (unselected column lines) are insufficient to turn on access component 304 of the unselected memory cells. Voltages applied to the unselected lines can have values such that a voltage difference between line 371 (selected column line) and each of lines 352, 353, and 354 (unselected row lines) and a voltage difference between line 351 (selected row line) and each of lines 372, 373, and 374 (unselected column lines) can be insufficient to turn on access component 304 of the unselected memory cells coupled to the selected lines (e.g., memory cells 303 at intersections of columns 312, 313, and 314 and row 321 and memory cells at intersections of rows 322, 323, and 324 and column 311). Thus, unselected memory cells are not accessed when the selected memory cell 303 is accessed.

If the above example memory operation is a write operation, write assist control unit 348 can be activated to provide a voltage on line 349 to turn on switch 341. Then, a current (e.g., current I2) from line 349 can flow to line 371. Memory device 300 can perform a program stage and cause two different currents, such as one current (e.g., current I2) from write assist control unit 348 and another current (e.g., T0 to flow through the selected memory cell to store information in the selected memory cell.

If the above example memory operation is a read operation, write assist control unit 348 can be deactivated. Thus, a current (e.g., current I2) may not be provided on line 349. Memory device 300 can perform a sense stage to sense a current on line 371 (selected line in this example) to retrieve information stored in the selected memory cell.

Figure 4:
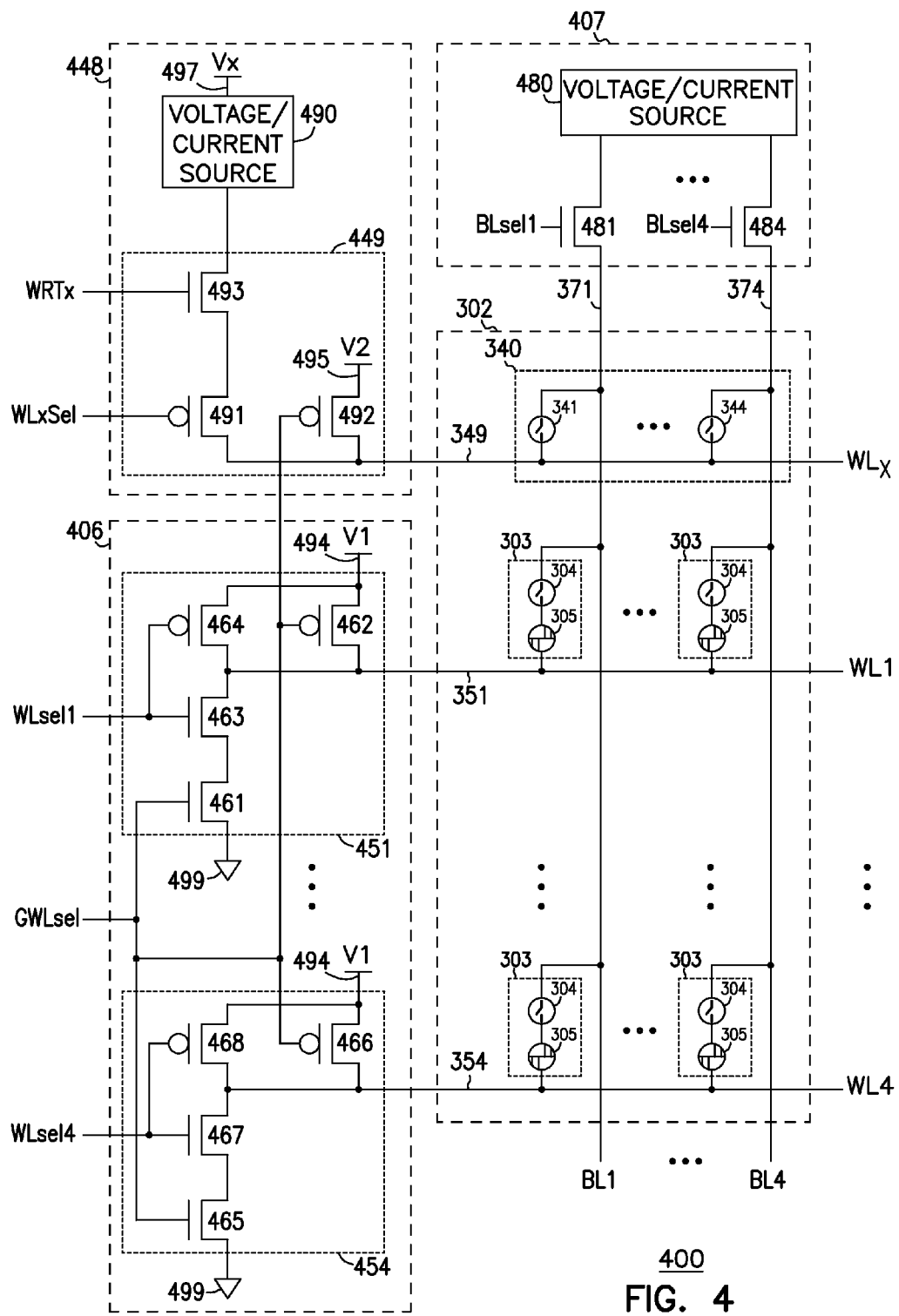
FIG. 4 shows a schematic diagram of a portion of a memory device including a write assist control unit, according to an embodiment of the invention.

FIG. 4 shows a schematic diagram of a portion of a memory device 400 including a write assist control unit, according to an embodiment of the invention. Memory device 400 can include elements that are similar to or identical to those of memory device 300, including memory array 302, memory cells 303, and switching circuit 340. Description of similar or identical elements between memory device 300 (FIG. 3) and memory device 400 (FIG. 4) is not repeated in the description of FIG. 4. For example, memory device 400 can include lines 351 to 354 and lines 371 to 374. For simplicity, only lines 351, 354, 371, and 374 are shown in FIG. 4.

Memory device 400 can include a select unit (e.g., row select unit) 406, a select unit (e.g., column select unit) 407, and a write assist control unit 448. These units can correspond to select unit 306, select unit 307, and write assist control unit 348, respectively, of memory device 300 of FIG. 3.

As shown in FIG. 4, select unit 406 can include circuits (e.g., driver circuits) 451 and 454 associated with lines 351 and 354, respectively. During a memory operation (e.g., a read or write operation), circuits 451 and 454 can operate to allow a current (e.g., a read or write current) to flow from a selected line among lines 371 to 374 to node 499 via circuit 451 or 454, depending on which memory cell is a selected memory cell. Node 499 can be coupled to ground potential (e.g., 0V) node. Thus, node 499 can receive a ground potential.

Select unit 407 can include a voltage and current source 480 and transistors 481 and 484 associated with lines 371 and 374, respectively. During a memory operation (e.g., a read or write operation), select unit 407 can selectively apply signals BLsel1 and BLsel4 to transistors 481 and 484 to selectively turn on or turn off these transistors 481 and 484 in order to couple a selected line among lines 371 to 374 to voltage and current source 480. This allows voltage and current source 480 to selectively apply a voltage and current to the selected line via transistor 481 or 484 as part of a memory operation to retrieve information from or store information in a selected memory cell.

Write assist control unit 448 can include a voltage and current source 490 and circuit (e.g., driver circuit) 449 including transistors 491, 492, and 493. During a write operation, write assist control unit 448 can selectively apply signals WRTx, WLxSel, and GWLsel to transistors 491, 492, and 493 to selectively turn on or turn off these transistors. For example, in a write operation, transistor 492 can be turned off and transistors 491 and 493 can be turned on. This can form a conductive path from node 497 to line 371 via transistors 491 and 493. A voltage (e.g., Vx from node 497) and current from voltage and current source 490 can be applied to line 349 via the formed conductive path. In a read operation, transistors 491 and 493 can be turned off and transistor 492 can be turned on to apply a voltage (e.g., V2 from node 495) to line 349.

As shown in FIG. 4, circuit 451 can include transistors 461, 462, 463, and 464. Circuit 451 can couple line 351 to either node 494 or node 499. For example, when line 351 is unselected, circuit 451 can turn off transistors 461 and 463 and turn on transistors 462 and 464 to couple line 351 to node 494 via a conductive path from line 351 to node 494 that includes transistors 462 and 464. When line 351 is selected, circuit 451 can turn on transistors 461 and 463 and turn off transistors 462 and 464 to couple line 351 to node 499 via a conductive path from line 351 to node 499 that includes transistors 461 and 463. Node 494 can be provided with a voltage V1 (e.g., a positive voltage). Voltage V1 and voltage V2 (at node 495) can have the same value (e.g., 3V).

Circuit 454 can couple line 354 to either node 494 or node 499. For example, when line 354 is unselected, circuit 454 can turn off transistors 465 and 467 and turn on transistors 466 and 468 to couple line 354 to node 494 via a conductive path from line 354 to node 494 that includes transistors 466 and 468. When line 354 is selected, circuit 454 can turn on transistors 465 and 467 and turn off transistors 466 and 468 to couple line 354 to node 499 via a conductive path from line 354 to node 499 that includes transistors 465 and 467.

Memory device 400 can use signal GWLsel to turn on or turn off transistors 461, 462, 465, 466, and 492. Memory device 400 can use signal WLsel1 to turn on or turn off transistors 463 and 464, and signal WLsel4 to turn on or turn off transistors 467 and 468.

Figure 5A:
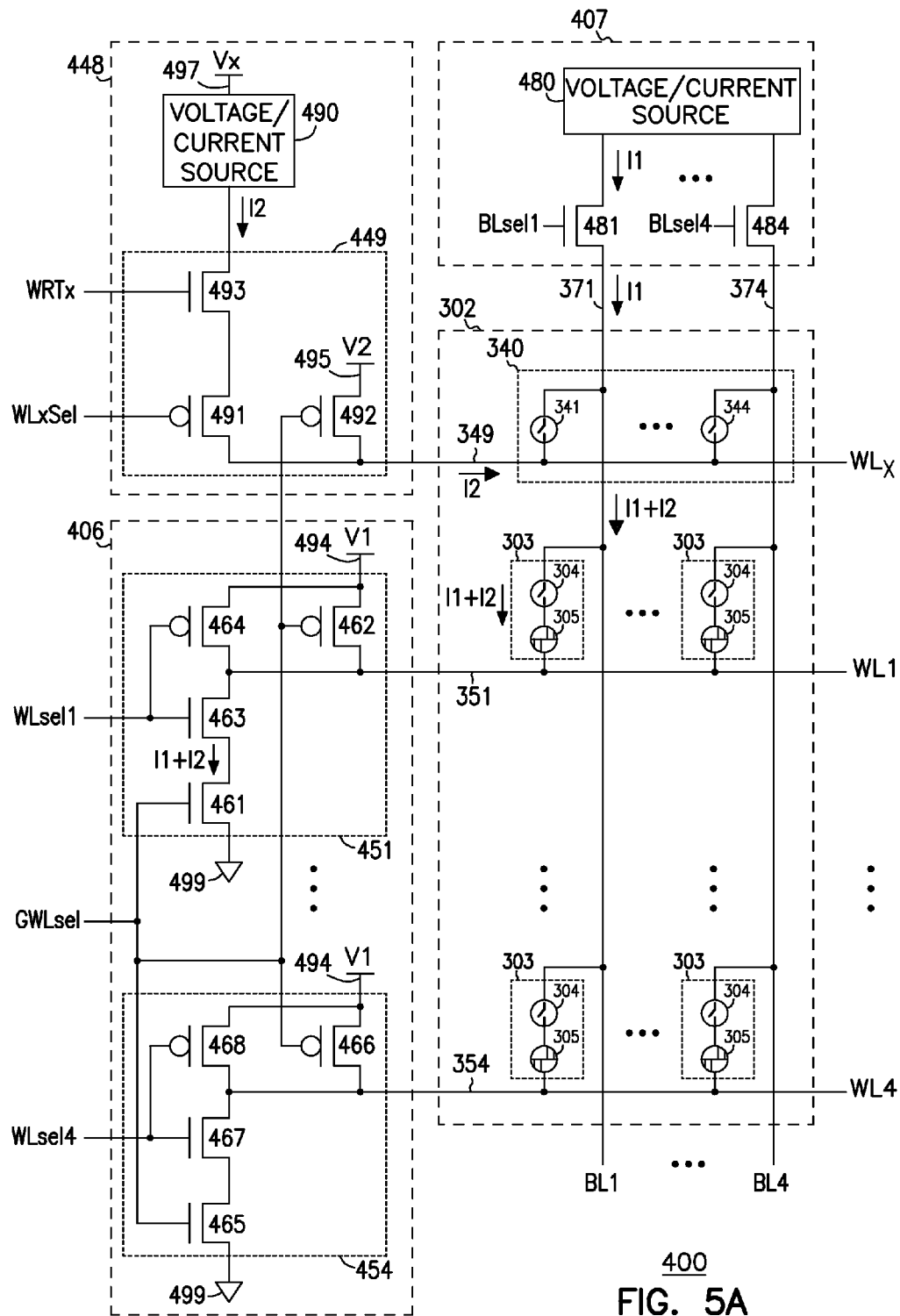
FIG. 5A shows the memory device of FIG. 4 including multiple write currents during an example write operation, according to an embodiment of the invention.

FIG. 5A shows a schematic diagram of a portion of a memory device 400 including currents (e.g., write currents) I1 and I2 during an example write operation, according to an embodiment of the invention. The example write operation associated with FIG. 5A assumes that memory cell 303 located at the cross point of lines 351 and 371 is a selected memory cell to store information in an example write operation. Thus, in this example, line 351 can be referred to as a selected line (e.g., row selected line) and line 371 can be referred to as a selected line (e.g., column selected line). Lines that are not directly coupled to the selected memory cell can be referred to as unselected lines. Thus, in this example, lines 354 and 374 can be referred to as unselected lines.

FIG. 5A shows different currents I1 and I2, which can be generated by voltage and current sources 480 and 490, respectively during a write operation. The current flowing through a selected memory cell in a write operation can include a combination of currents I1 and I2 (e.g., the sum of currents I1 and I2). The values of currents I1 and I2 can be the same or different, provided that the sum of current I1 and I2 can cause a selected memory cell to change its state (e.g., change the phase of the material of storage element 305 in the selected memory cell) to reflect information being stored in the selected memory cell. Thus, the value of current I1 can be less than, equal to, or greater than the value of current I2.

In the example write operation, column select unit 407 can turn on transistor 481 to pass current I1 from voltage and current source 480 to line 371. Transistor 492 can be turned off. Write assist control unit 448 can turn on transistors 491 and 493 to apply a voltage (e.g., voltage Vx at node 497) to line 349 via transistors 491 and 493. The voltage on line 349 can have a value such that a voltage difference between lines 349 and 371 can exceed the threshold voltage of switch 341 to cause it to turn on. Other switches coupled to line 349, including switch 344, of switching circuit 340, can be turned off. For example, switch 344 can be turned off by turning off transistor 484 to keep the voltage difference between line 349 and line 374 (unselected line) less than the threshold voltage of switch 344. When switch 341 turns on, memory device 400 can pass current I2 from voltage and current source 490 to line 371 (via transistors 491 and 493 and switch 341). From line 371, current I2 and current I1 can flow to line 351 and node 499 via the selected memory cell and transistors 461 and 462 to store information in the selected memory cell.

FIG. 5B is an example timing diagram for some signals of FIG. 5A during the example write operation, according to an embodiment of the invention. The waveforms associated with the signals shown in FIG. 5B are not scaled. The write operation associated with FIG. 5B can include a time interval 501 (e.g., between times T0 and T1), a time interval 502 (e.g., between times T1 and T2), and a time interval 503 (e.g., between times T2 and T3). Time interval 501 can be a time interval where the selected memory cell is accessed (e.g., selected). Time intervals 502 and 503 can be time intervals where information can be stored in the selected memory cell.

The waveforms of selected lines 351 and 371 (associated with signals WL1 and BL1) are shown at the top of FIG. 4. Levels 510 through 516 associated with signals WL1 and BL1 correspond to different voltages on lines 351 and 371 at different times during time intervals 501, 502, and 503.

Memory device 400 (FIG. 5A) can cause current I1 (FIG. 5A) to flow through the selected memory cell during at least a portion of a time interval between times T0 and T3. For example, current I1 can flow through the selected memory cell right after the selected memory cell is accessed at some time (e.g., when access component of the selected memory cell turns on) during time interval 501 and continue to flow through the selected memory cell during time intervals 502 and 503. Memory device 400 can cause current I2 to flow through the selected memory cell during time interval 503.

During the write operation, signals that are not associated with selected lines can be deactivated (e.g., kept at the same level), so that memory cells associated with unselected lines are not accessed. For example, as shown in FIG. 5B, signal BLsel4 can remain at the same level 520 (e.g., zero volts), such that transistor 484 (FIG. 5A) can turn off (or remain in an off state) to decouple line 374 from voltage and current source 480. Signal WLsel4 can remain at the same level 530 (e.g., Vcc), such that transistor 466 and 468 (FIG. 5A) can turn off (or remain in an off state) to decouple line 354 from node 494.

Signals BLsel1, GWLsel, and WLsel1 associated with the selected lines can be activated, such that their respective levels can change from one signal level (e.g., before time T0) to another level (e.g., at time T0) to access the selected memory cell and store information in the selected memory cell. In FIG. 5B, the dashed-line waveforms associated with signals BLsel and WLxSel can be variations (e.g., alternative embodiments) of the solid-line waveforms of signals BLsel and WLxSel, respectively. The following description refers to both FIG. 5A and FIG. 5B.

At time T0, signal BLsel1 can change from level 521 (e.g., 3V) to level 522 (e.g., 6V) to turn on transistor 481 to apply a voltage from voltage and current source 480 to line 371 and cause the voltage on line 371 to change (e.g., increase). As shown in FIG. 5B, signal BL1 on line 371 may increase from a level (e.g., initial level) 515 (e.g., 3V) before time T0 to a level 516 (6V) after time T0.

At time T0 (FIG. 5B), signal GWLsel can change from level 531 (e.g., 0V) to level 532 (e.g., 6V) and signal WLsel1 can change from level 541 (e.g., 0V) to level 542 (e.g., 6V). This can turn on transistors 461 and 463 and couple line 351 to node 499. As shown in FIG. 5B, signal WL1 on line 351 may decrease from a level 515 before time T0 to a level 510 (e.g., 0V) after time T0. Level 510 can have a voltage corresponding to the voltage at node 499 (e.g., 0V).

Memory device 400 can be configured such that a voltage difference between line 371 (associated with signal BL1) and line 351 (associated with signal WL1) can exceed the threshold voltage of access component 304 of the selected memory cell and turn on that access component 304 during time interval 501. During at least a portion of time interval 501 and during time intervals 502 and 503, current I1 can to flow through the selected memory cell and then to node 499 via a conductive path that includes line 371, the selected memory cell, line 351, and transistors 461 and 463.

Access component 304 may operate such that after it turns on (e.g., after time T1), signal BL1 may decrease from level 516 to level 513 (e.g., holding level). Signal WL1 may increase from level 510 to level 511.

At time T1, signal WLxSel can change from level 551 (e.g., 2V) to level 552 (e.g., 0V) to turn on transistor 491.

At time T2 signal WRTx can change from level 561 (e.g., 3V) to level 562 (e.g., 7V) to turn on transistor 493 to apply a voltage (e.g., Vx) at node 497 to line 349 (via transistors 491 and 493 that turn on). Memory device 400 can be configured to provide voltage Vx at node 497 with a value (e.g., 12V), such that the voltage difference between lines 349 and 371 (e.g., during time interval 503) can exceed the threshold voltage of switch 341 and turn on switch 341 to allow current I2 to flow from line 349 to line 371 via switch 341. When switch 341 turns on, the voltages of signals WL1 on line 351 and BL1 on line 371 may increase. For example, as shown in FIG. 5B, signal BL1 on line 371 may increase from a level 513 before time T2 to a level 514 (2V) after time T2. Signal WL1 on line 351 may increase from a level 511 (e.g., 0.5V) to level 512 (e.g., 1V) after time T2. During time interval 503, current I2 from line 349 can flow through the selected memory cell and then to node 499 via a conductive path that includes line 349, switch 341, conductive line 371, the selected memory cell, line 351, and transistors 361 and 363.

Thus, as described above with reference to FIG. 5A and FIG. 5B, during a write operation, multiple currents (e.g., currents I1 and I2) from multiple current sources can flow through the selected memory cell to store information in the selected memory cell.

Using multiple currents (e.g., currents I1 and I2) may improve some features of memory device 400 relative to some conventional memory devices. For example, some conventional memory devices may provide only one write current (e.g., a current similar to current T0 during a write operation to store information in a selected memory cell. Memory device 400, however, can provide multiple currents such as currents I1 and I2, as described above. Thus, circuitry (e.g., column select unit 407) to generate current I1 in memory device 400 can have a smaller size than that of similar circuitry in some conventional memory devices. This may lead to overall reduction in size, cost, or both, of memory device 400 in comparison with some conventional memory devices. Further, switching circuit 340 may be placed closer to memory cells 303 (possibly more than in a single instance in memory array 302) so as to reduce the series resistance on lines 371, 372, 373, and 374. This may lead to less voltage drop on these lines and more compact memory array (e.g., lines 371, 372, 373, and 374 may be narrower).

Figure 6A:
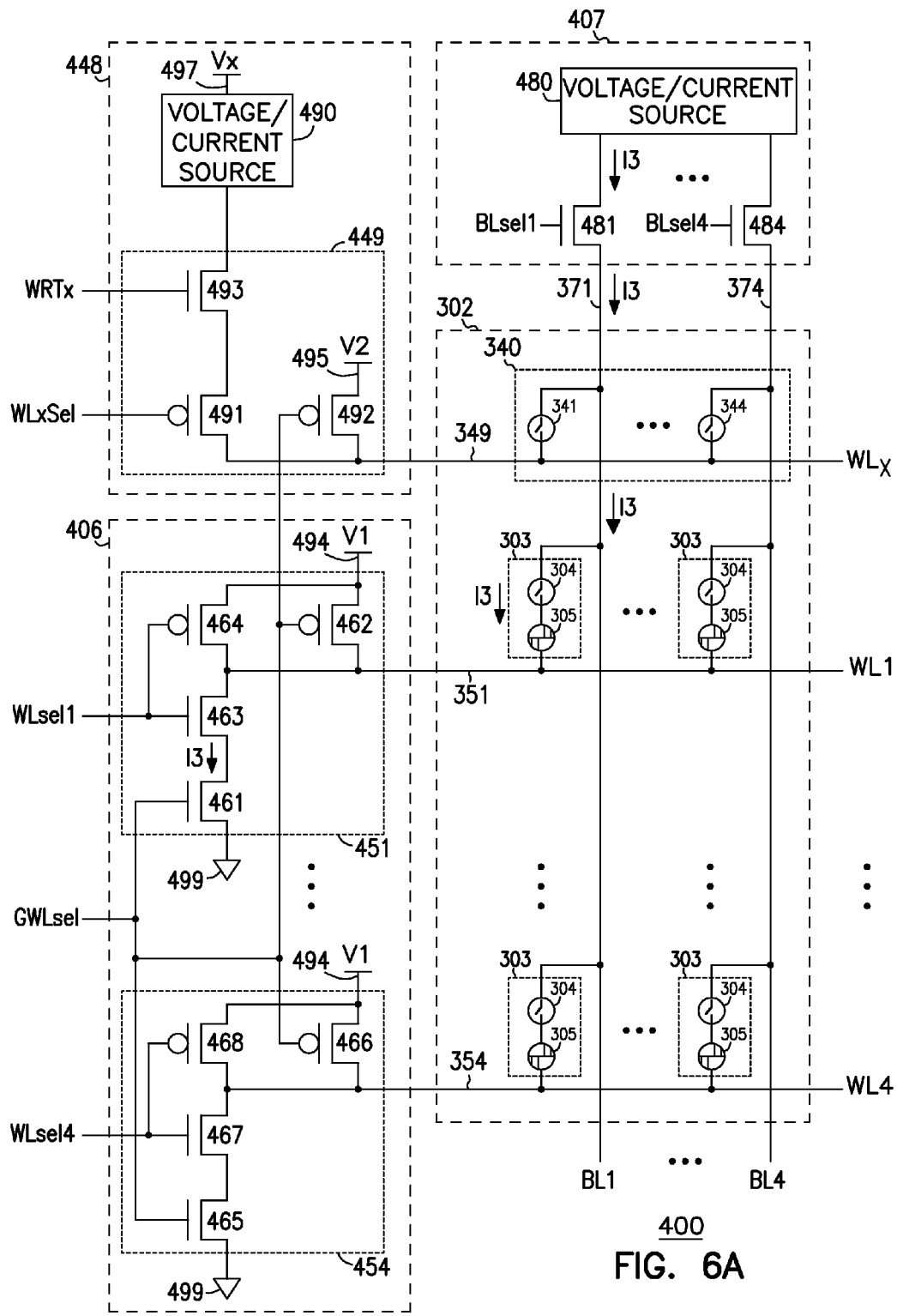
FIG. 6A shows the schematic diagram of the portion of the memory device of FIG. 4 including a read current during an example read operation, according to an embodiment of the invention.

FIG. 6A shows a schematic diagram of the portion of the memory device 400 including a current I3 (e.g., read current) during an example read operation, according to an embodiment of the invention. Similar to the description with respect to FIG. 5A, the example read operation associated with FIG. 6A assumes that memory cell 303 located at the cross point of lines 351 and 371 is a selected memory cell. In FIG. 6A, however, the memory device 400 can operate to retrieve information from (instead of store information in) the selected memory cell. Similar to the description with respect to FIG. 5A, lines 351 and 371 can be referred to as selected lines (e.g., row and column selected lines, respectively). Other lines, such as lines 354 and 374, can be referred to as unselected lines.

Current I3 in FIG. 6A can be generated by voltage and current source 480 during a read operation. Memory device 400 can operate to cause current I3 to flow through the selected memory cell via line 371. In a read operation, write assist control unit 448 can be deactivated (e.g., disabled). Current I2 may not be generated. No current (e.g., current I2) from line 349 may flow from voltage and current source 490 to line 349. Thus, in a read operation, the current flowing through the selected memory cell can include only a single current, such as current I3 as shown in FIG. 6A. The value of current I3 in a read operation can be different from the value of current I1 in a write operation. For example, the value of current I3 in a read operation can depend on the value of information stored in a selected memory cell. In a read operation, memory device 400 can measure the value of current I3 to determine the value of information stored in a selected memory cell based on the measured value of I3.

Memory device 400 can operate to pass current I3 to node 499 through the selected memory cell similarly to that of current I1. For example, current I3 can flow from line 371 to node 499 via a conductive path that includes line 371, the selected memory cell, line 351, and transistors 461 and 463.

Figure 6B:
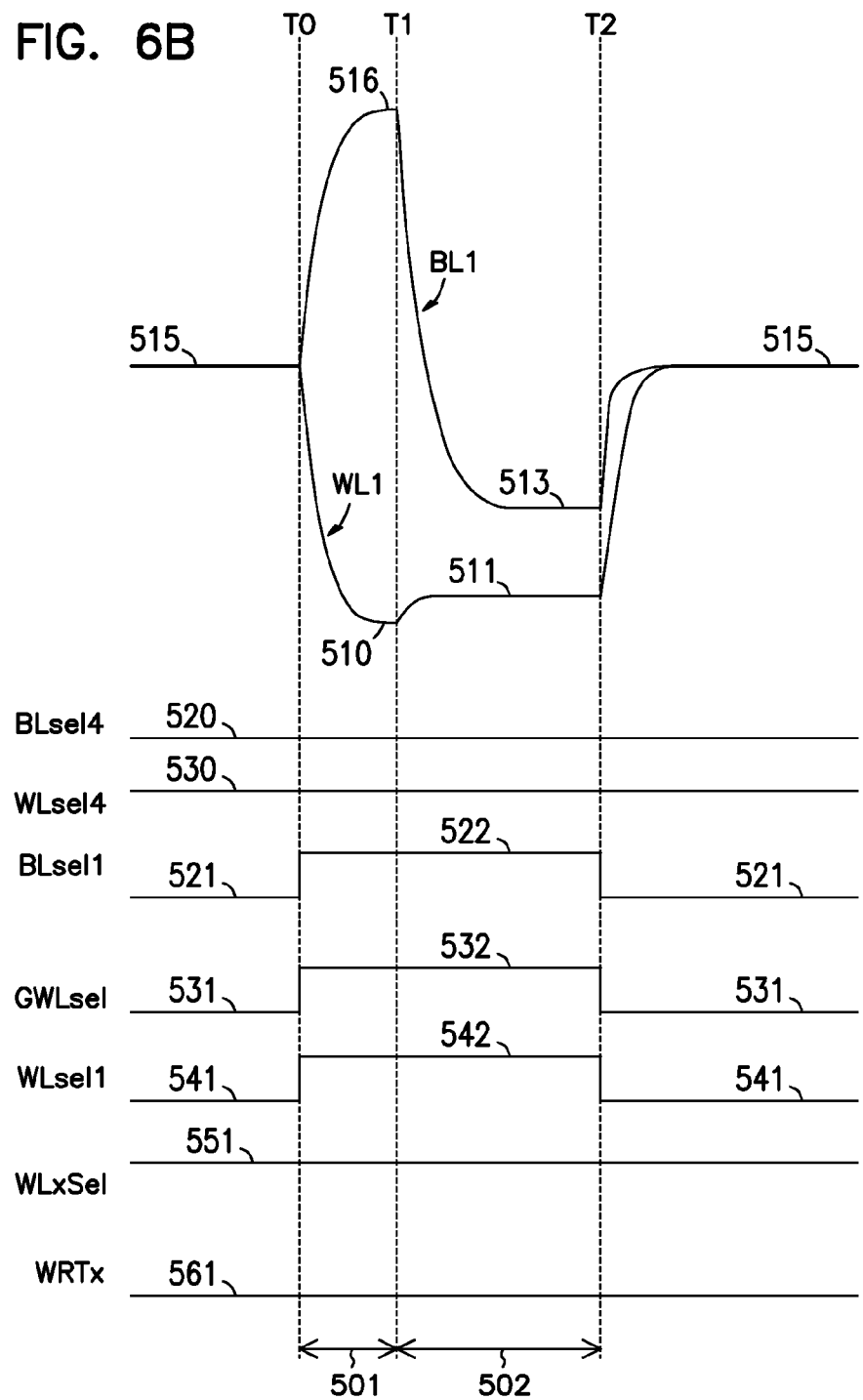
FIG. 6B is an example timing diagram for some signals of FIG. 6A during the example read operation, according to an embodiment of the invention.

FIG. 6B is an example timing diagram for some signals of FIG. 6A during the example read operation, according to an embodiment of the invention. The read operation associated with FIG. 6B can include a time interval 501 (e.g., between times T0 and T1) and a time interval 502 (e.g., between times T1 and T2). Time interval 501 can be a time interval where a selected memory cell can be accessed (e.g., selected). Time interval 502 can be a time interval where information can be retrieved from the selected memory cell.

As shown in FIG. 5B, signal BLsel4 can remain at the same level 520, such that transistor 484 (FIG. 5A) can turn off (or remain in an off state) to decouple line 374 (unselected line) from voltage and current source 480. Signal WLsel4 can remain at the same level 530, such that transistor 466 and 468 can turn off (or remain in an off state) to decouple line 354 (unselected line) from node 494. Signals BLsel1, GWLsel, and WLsel1 associated with the selected lines can be activated, such that their respective levels can change from one signal level (e.g., before time TO) to another level (e.g., at time TO) to access the selected memory cell (e.g., during time interval 501) and retrieve information from the selected memory cell (e.g., during time interval 502).

In a read operation, switches 341 to 344 can be turned off. As shown in FIG. 6B, signals WLxSel and WRTx can remain at the same levels 551 and 561, respectively, such that transistors 491 and 493 do not turn on, so that line 349 is not provided with a voltage (e.g., Vx) from node 497. Line 349 can be coupled to node 495 via a conductive path that includes transistor 492. As a result, the voltage difference between line 349 and each of lines 371 to line 374 is insufficient to turn on switches 341 to 344.

Figure 7:
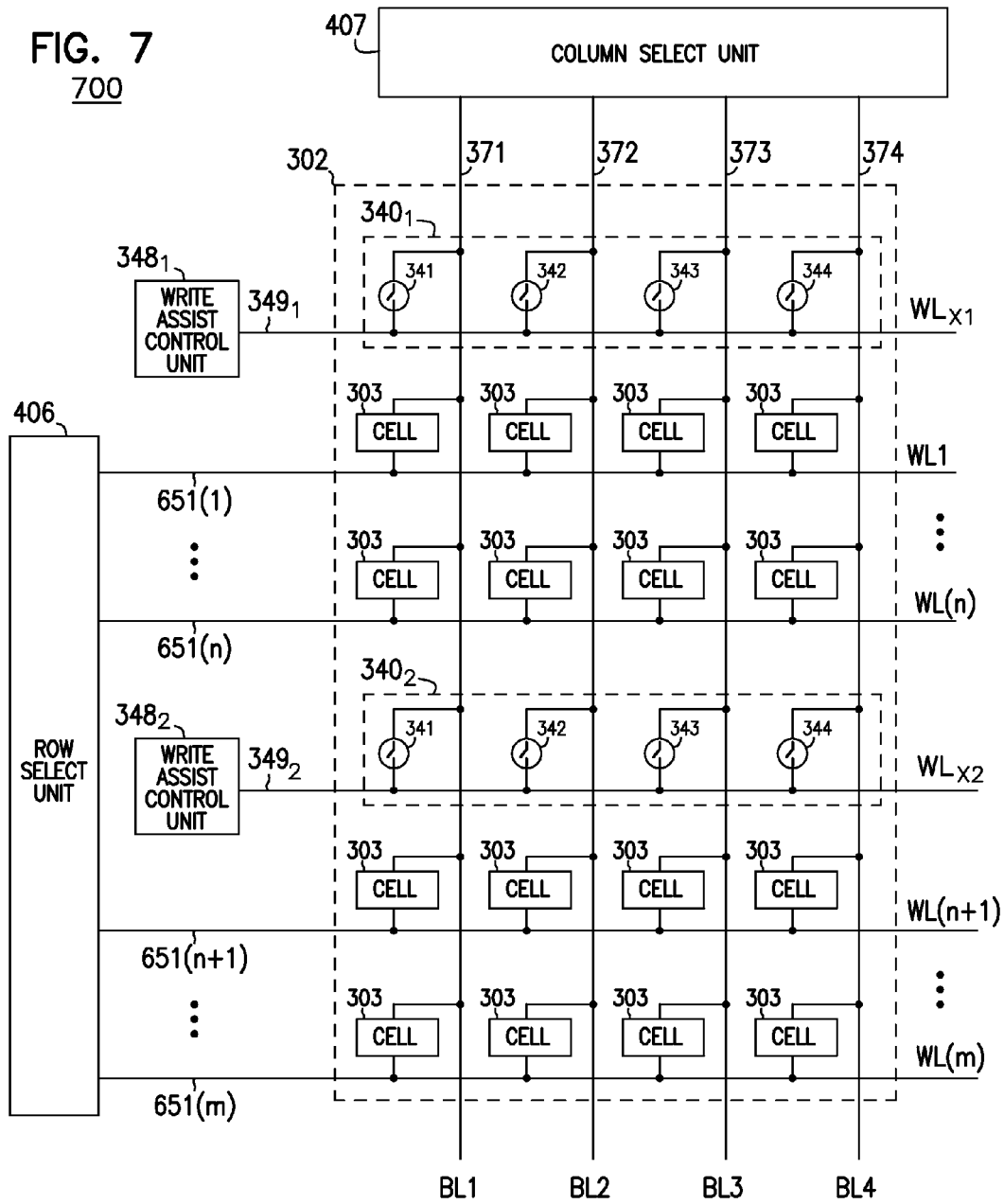
FIG. 7 shows a schematic diagram of a portion of a memory device including multiple write assist control units and multiple switching circuits, according to an embodiment of the invention.

FIG. 7 shows a schematic diagram of a portion of a memory device 700 including multiple write assist control units $348_1$ and $348_2$ and multiple switching circuits $340_1$ and $340_2$, according to an embodiment of the invention. Memory device 700 includes elements that are similar to or identical to those of memory device 300 (FIG. 3) and memory device 400 (FIG. 4), including memory array 302, memory cells 303, row and column select units 306 and 307, and lines 371 to 374. Each of switching circuits $340_1$ and $340_2$ in FIG. 7 can be similar to or identical to switching circuit 340 of FIG. 3 or FIG. 4. Each of write assist control units $348_1$ and $348_2$ can be similar to or identical to write assist control unit 348 of FIG. 3 or write assist control unit 448 of FIG. 4. Description of similar or identical elements between memory device 300 (FIG. 3), memory device 400 (FIG. 4), and memory device 700 (FIG. 7) is not repeated in the description of FIG. 7. FIG. 7 shows an example of two write assist control units $348_1$ and $348_2$ and two corresponding lines $349_1$ and $349_2$ and two corresponding switching circuits $340_1$ and $340_2$ The number of such units and corresponding lines and corresponding switching circuits may vary (e.g., may be greater than two).

As shown in FIG. 7, memory device 700 can include lines $349_1$ and $349_2$ that can carry signals $WL_{X1}$ to $WL_{X2}$, respectively; lines $651(1)$ to $651(n)$ that can carry signals $WL_{X1}$ to $WL(n)$, respectively; and lines $651(n+1)$ to $651(m)$ that can carry signals $WL(n+1)$ to $WL(m)$, respectively. Each of lines $349_1$ and $349_2$ can correspond to line 349 of FIG. 3 and FIG. 4. Each of lines $651(1)$ to $651(n)$, and lines $651(n+1)$ to $651(m)$, can be an access line and can correspond to one of lines 351 to 354 of FIG. 3 or FIG. 4

The number of lines $651(1)$ to $651(n)$ can be greater than two. The number of lines $651(n+1)$ to $651(m)$ can be greater than two. The total number of lines among lines 651(1) to 651(n) can be the same as the total number of lines among lines 651(n+1) to 651(m).

Each of lines $349_1$ and $349_2$ can be located at different locations in memory array 302 and can be associated with a separate group of lines (e.g., access lines) among lines 651(1) to 651(n) and lines 651(n+1) to 651(m). For example, line $349_1$ can be associated with (e.g., in the same group as) lines 651(1) to 651(n). Line $349_2$ can be associated with lines 651(n+1) to 651(m).

Memory device 700 can be configured to selectively activate switching circuits $340_1$ and $340_2$ during a write operation, such that only one of write assist control units $348_1$ and $348_2$ can be activated and the other unit can be deactivated. The activated write assist control unit ($348_1$ or $348_2$) can operate similarly to write assist control unit 348 (FIG. 3) or write assist control unit 448 (FIG. 4). For example, if line 371 is a selected line during a write operation, the activated write assist control unit ($348_1$ or $348_2$) can operate to provide a current (e.g., I2) from a corresponding line $349_1$ or $349_2$ to line 371 during the write operation.

Memory device 700 can be configured to determine (e.g., select) which of write assist control units $348_1$ and $348_2$ to be activated during a write operation based on the location (physical location) of a selected memory cell relative to the locations (physical locations) of lines $349_1$ and $349_2$. For example, memory device 700 can be configured to activate write assist control unit ($348_1$ or $348_2$) associated with line $349_1$ or $349_2$ that is physically closer to the selected memory cell. Memory device 700 can deactivate the write assist control unit ($348_1$ or $348_2$) associated with line $349_1$ or $349_2$ that is farther from the selected memory cell. Thus, in this example, if memory cell 303 located at the cross point of lines 651(1) and 371 is a selected memory cell in a write operation, then memory device 700 can select to activate write assist control unit $348_1$ to pass a current (e.g., I2) from line $349_1$ to line 371 and then to the selected memory cell. In another example, if memory cell 303 located at the cross point of lines 651(n) and 371 is a selected memory cell in a write operation, then memory device 700 can select to activate write assist control unit $348_2$ because it is closer to the selected memory cell than write assist control unit $348_1$.

In a write operation, if the distance from the selected memory cell to each of lines $349_1$ and $349_2$ is the same, then memory device 700 can select to activate the write assist control units ($348_1$ or $348_2$) associated with line $349_1$ or $349_2$ that is closer to column select unit 307.

In an alternative configuration, memory device 700 can be configured to determine (e.g., select) which of write assist control units $348_1$ and $348_2$ to be activated during a write operation based on line groups formed by each of lines $349_1$ and $349_2$ and lines 651(1) to 651(n) and 651(n+1) to 651(m). For example, line $349_1$ and lines 651(1) to 651(n) can be grouped into one group, and line $349_2$ and lines 651(n+1) to 651(m) can be grouped into another group. Thus, in this example, if memory cell 303 located at the cross point of lines 651(1) and 371 is a selected memory cell in a write operation, then memory device 700 can select to activate write assist control unit $348_1$ because it is associated with line $349_1$, in which lines $349_1$ and 651(1) are in the same group. In another example, if memory cell 303 located at the cross point of lines 651(n) and 371 is a selected memory cell in a write operation, then memory device 700 can also select to activate write assist control unit $348_1$ because it is also associated with line $349_1$, in which lines $349_1$ and 651(n) are in the same group.

In another configuration, lines 651(1) to 651(n) and 651(n+1) to 651(m) can be groups into different groups and each of such different groups can be associated with at least two write assist control units and their associated lines. For example, lines 651(1) to 651(n) can be grouped into one group and can be associated with both write assist control units $348_1$ and $348_2$ and their corresponding lines $349_1$ and $349_2$. Lines 651(n+1) to 651(m) can be grouped into another group and can be associated with two other write assist control units (not shown in FIG. 7, but can be similar to write assist control units $348_1$ and $348_2$) and their corresponding lines (not shown in FIG. 7, but can be similar to lines $349_1$ and $349_2$). In this configuration, memory device 700 can activate write assist control units $348_1$ and $348_2$ concurrently (in other the words, at the same time) if a selected memory cell 303 coupled to lines 651(1) to 651(n) is selected to store information in a write operation. Since each of write assist control units $348_1$ and $348_2$ can provide a separate current (similar to current I2), two different currents can flow from corresponding write assist control units $348_1$ and $348_2$ (in addition to current T0 to a selected memory cell during a write operation of storing information in that selected memory cell. For example, one current similar to current I2 can flow from write assist control unit $348_1$ through the selected memory cell via a conductive path that includes a portion of line $349_1$, one of switches 341, 342, 343, and 344 (of switching circuit $340_1$) that turns on, and a portion of one of lines 371, 372, 373, and 374 coupled to the selected memory. Another current similar to current I2 can flow from write assist control unit $348_2$ through the selected memory cell via a conductive path that includes a portion of line $349_2$, one of switches 341, 342, 343, and 344 (of switching circuit $340_2$) that turns on, and a portion of one of lines 371, 372, 373, and 374 coupled to the selected memory.

Arranging multiple switching circuits, such as switching circuits $340_1$ and $340_2$, in different locations in memory array 302 in memory device 700 may allow a current (e.g., current I2) to be generated locally relative to the location of a selected memory cell. This may allow such current to be locally passed to the selected memory cell. Thus, a large voltage drop (e.g., IR drop) may be avoided.

Figure 8:
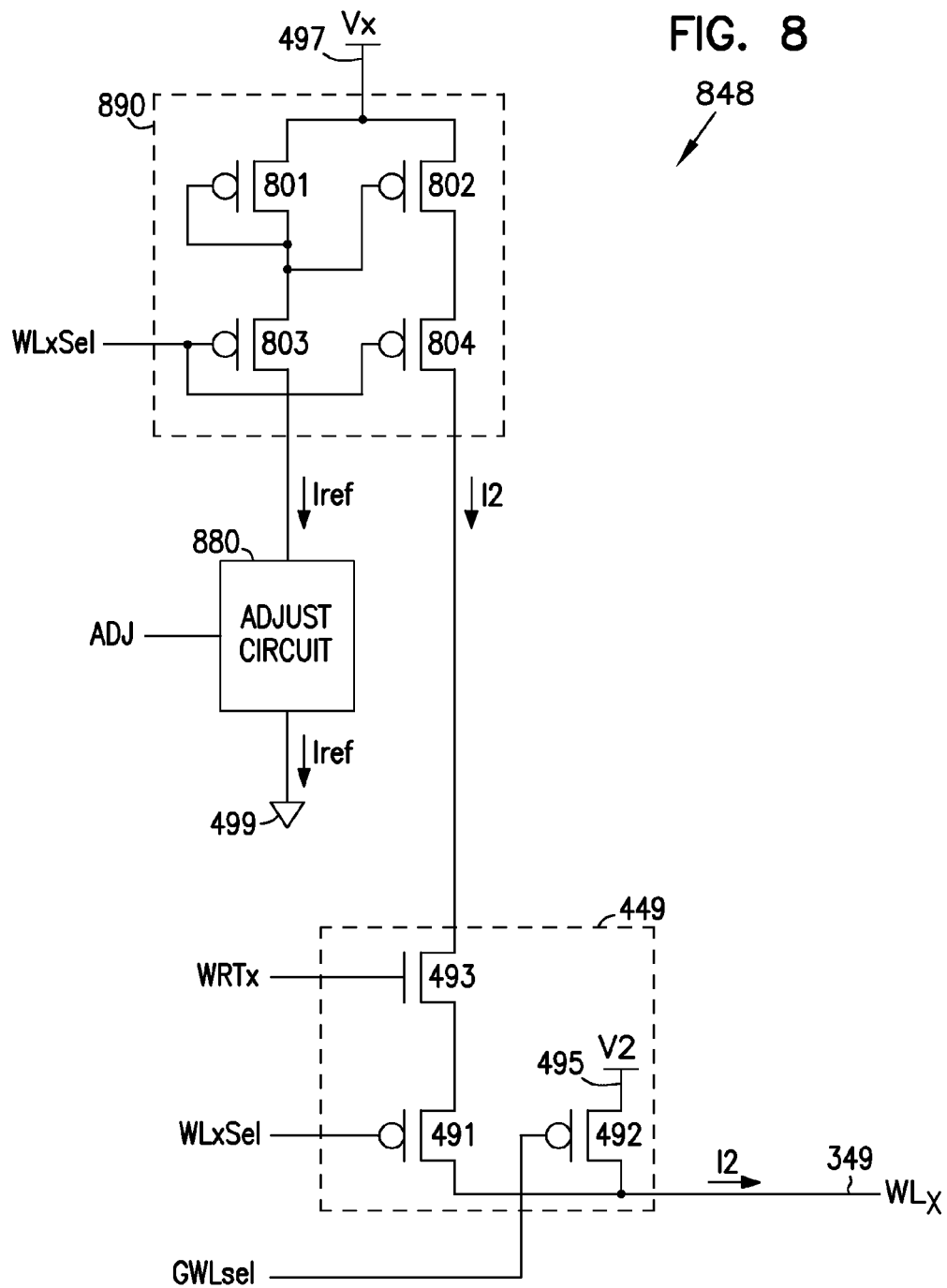
FIG. 8 shows a schematic diagram of a write assist control unit, according to an embodiment of the invention.

FIG. 8 shows a schematic diagram of a write assist control unit 848, according to an embodiment of the invention. Write assist control unit 848 can be used for write assist control unit 348 (FIG. 3) or write assist control unit 448 (FIG. 4).

As shown in FIG. 8, write assist control unit 848 can include a circuit 449, which can include elements that are similar to or identical to those of FIG. 4, including transistors 491, 492, and 493, line 349, and associated signals WLxSel, GWLsel, WRTx, and WLx. As described above with reference to FIG. 4 through FIG. 6B, circuit 449 can operate to couple line 349 to node 495 during a read operation (e.g., when write assist control unit 848 is deactivated). During a write operation, circuit 449 can operate to provide line 349 with a voltage (e.g., Vx at node 497) and cause current I2 to flow from line 349 to a selected line, such as a selected column line among lines 371 to line 374 in FIG. 4.

As shown in FIG. 8, write assist control unit 848 can include a voltage and current source 890, which can be used in voltage and current source 490 of FIG. 4. Voltage and current source 890 can include transistors 801, 802, 803, and 804, which can be arranged to generate current I2. Voltage and current source 890 can also generate current Iref flowing between node 497 and node 499. The value of current I2 can be based on the value of a current Iref. For example, transistors 801, 802, 803, and 804 can be arranged as a current mirror and their transistor size can be selected to generate current I2 such that the value of current I2 can be proportional (e.g., linear proportional) to the value of current Iref. Thus, the value of current I2 can be selected by adjusting the value of Iref. As an example, the value of current I2 can be the same as the value of current Iref.

Write assist control unit 848 can include an adjust circuit 880 to select (e.g., adjust) the value of current Iref in order to select the value of I2. Adjust circuit 880 can include a variable resistor (not shown) where its resistance can be controlled (e.g., varied) by a signal (e.g., an adjust signal) ADJ in order to adjust the value of current Iref. For example, the variable resistor of adjust circuit 880 can include a transistor (e.g., n-channel field effect transistor) coupled in series between transistor 803 and node 499. The value of current Iref flowing through the transistor 803 to node 499 can be selected (e.g., adjusted) by providing signal ADJ with an appropriate level (e.g., voltage). For example, providing different voltage to signal ADJ, different value for current Iref and current I2 can be selected.

Current I2 can be combined with another current (e.g., current TO during a write operation to store information in a selected memory cell of a memory device, as shown in FIG. 1 through FIG. 7.

The illustrations of apparatuses (e.g., memory devices 100, 200, 300, 400, and 700) and methods (e.g., operating methods associated with memory devices 100, 200, 300, 400, and 700) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200, 300, 400, and 700) or a system (e.g., a computer, a cellular phone, or other electronic system) that includes a device such as memory devices 100, 200, 300, 400, and 700.

Any of the components described above with reference to FIG. 1 through FIG. 8 can be implemented in a number of ways, including simulation via software. Thus, apparatuses (e.g., memory devices 100, 200, 300, 400, and 700 and write assist control unit 848) described above may all be characterized as "modules" (or "module") herein. For example, a portion or an entire memory device 100, 200, 300, 400, or 700 and write assist control unit 848 described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 300, 400, and 700 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

The embodiments described above with reference to FIG. 1 through FIG. 8 include apparatuses and methods for first conductive lines, second conductive lines, and a memory array including memory cells, each of the memory cells coupled between one of the first conductive lines and one of the second conductive lines. At least one of such apparatuses and methods can include a module configured to cause a first current from a first current source and a second current from a second current source to flow through a selected memory cell among the memory cells during an operation of storing information in the selected memory cell. Other embodiments including additional apparatus and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A apparatus comprising:
   a data line;
   a first conductive line and a second conductive line;
   a memory cell coupled between the data line and the second conductive line; and
   a module configured to cause a first current from a first current source to flow between the first conductive line and the data line through the memory cell during an operation of storing information in the memory cell, and to cause a second current from a second current source to flow between the second conductive line and the data line through the memory cell during the operation of storing information in the memory cell.

2. The apparatus of claim 1, further comprising a switch coupled between the data line and the first conductive line, and the module is configured to turn on the switch during the operation to form part of a conductive path between the first conductive line and the data line during the operation.

3. The apparatus of claim 2, wherein the module is configured to apply a voltage difference between the first conductive line and the data line such that the voltage difference exceeds a threshold voltage of the switch.

4. The apparatus of claim 2, wherein the module is configured to apply a voltage difference between the second conductive line and the data line, such that the voltage difference exceeds a threshold voltage of an access element of the memory cell to allow the first current to flow through the memory cell.

5. The apparatus of claim 1, wherein the memory cell includes a variable resistance material configured to store information.

6. The apparatus of claim 2, wherein the switch includes a variable resistance material.

7. The apparatus of claim 1, wherein the first and second conductive lines extend in a same direction.

8. The apparatus of claim 1, wherein data line extends in a first direction and each of the first and second conductive lines extends in a second direction.

9. A apparatus comprising:
   a data line;
   a first switch coupled to the data line and a first conductive line;

a second switch coupled to the data line and a second conductive line;

a first memory cell coupled to the data line;

a second memory cell coupled to the data line; and a module configured turn on the first switch to pass a current from the first conductive line to the first memory cell during an operation of storing information in the first memory cell, and to pass another current from the data line to the first memory cell during the operation of storing information in the first memory cell.

10. The apparatus of claim 9, wherein the module is configured turn on the second switch to pass a current from the second conductive line to the second memory cell during an operation of storing information in the second memory cell, and to pass another current from the data line to the second memory cell during the operation of storing information in the second memory cell.

11. The apparatus of claim 9, further comprising a first unit to provide the current to the first conductive line during the operation of storing information in the first memory cell, and a second unit to provide the current to the second conductive line during the operation of storing information in the second memory cell.

12. The apparatus of claim 9, wherein each of the first and second memory cells includes a variable resistance material.

13. The apparatus of claim 9, wherein each of the first and second switches includes a variable resistant material.

14. The apparatus of claim 9, wherein the first memory cell is coupled to a first access line, the second memory cell is coupled to a second access line, and the first and second access lines and the first and second conductive lines extend in a same direction.

15. The apparatus of claim 14, wherein the first access line is between the first and second conductive lines.

16. The apparatus of claim 15, wherein the first conductive line is between the first and second access lines.

17. A apparatus comprising:

a data line;

a memory cell coupled to the data line, the memory cell including a variable resistance material configured to store information; and a module configured to access the memory cell during a read operation and a write operation, to pass a current to the memory cell during the read operation, and to pass multiple currents to the memory cell during the write operation.

18. The apparatus of claim 17, wherein the module is configured to pass the current from a first current source to the memory cell during the read operation, and to pass the multiple currents to the memory cell from the first current source and a second current source during the write operation.

19. The apparatus of claim 17, wherein the module is configured to pass the multiple currents to the memory cell at different times during the write operation.

20. The apparatus of claim 17, wherein the memory cell is included in a cross-point memory array of the apparatus.

* * * * *